(12) United States Patent
Sugiyama

(10) Patent No.: US 9,984,453 B2
(45) Date of Patent: May 29, 2018

(54) MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Toru Sugiyama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 14/923,695

(22) Filed: Oct. 27, 2015

(65) Prior Publication Data

US 2016/0131982 A1 May 12, 2016

(30) Foreign Application Priority Data

Nov. 6, 2014 (JP) .................................. 2014-226407

(51) Int. Cl.
| | |
|---|---|
| *G03B 27/42* | (2006.01) |
| *G06T 7/00* | (2017.01) |
| *G01B 11/14* | (2006.01) |
| *G03F 9/00* | (2006.01) |
| *G06T 7/73* | (2017.01) |
| *G06T 7/13* | (2017.01) |
| *G06K 9/00* | (2006.01) |

(Continued)

(52) U.S. Cl.
CPC ............ *G06T 7/0008* (2013.01); *G01B 11/14* (2013.01); *G03F 9/7088* (2013.01); *G06K 9/00134* (2013.01); *G06K 9/3216* (2013.01); *G06K 9/4604* (2013.01); *G06T 7/13* (2017.01); *G06T 7/74* (2017.01); *G06T 2207/30148* (2013.01)

(58) Field of Classification Search
CPC .... G03F 9/7088; G03F 9/7076; G03F 9/7003; G03F 7/70633; G03F 9/7084; G03F 9/7046; G03F 7/0002; G03F 7/70775; G03F 9/7069; G03F 7/707; G03F 7/7085; G03F 9/7049; G03F 9/7092; G03F 1/42; G03F 7/70683; G03F 7/70141; G03F 7/70616; G03F 9/7011
See application file for complete search history.

(56) References Cited

U.S. PATENT DOCUMENTS 5,136,661 A * 8/1992 Kobayasi .................. G06T 7/73
  382/209
6,920,249 B2 * 7/2005 Rinn ..................... G06K 9/4609
  250/202

(Continued)

FOREIGN PATENT DOCUMENTS

JP     2000260699 A     9/2000

*Primary Examiner* — Mesfin Asfaw
(74) *Attorney, Agent, or Firm* — Rossi, Kimms & McDowell LLP

(57) ABSTRACT

The present invention provides a measurement apparatus for measuring a position of a mark formed on a substrate, the apparatus including a detector configured to detect the mark to generate a detection signal, and a processor configured to process the generated detection signal to obtain a position of the mark, wherein the processor is configured to limit a range of the detection signal to be processed to obtain the position of the mark based on a statistic representing dispersion of a plurality of the position obtained with respect to a plurality of the mark.

15 Claims, 5 Drawing Sheets

(51) Int. Cl.
   *G06K 9/32*    (2006.01)
   *G06K 9/46*    (2006.01)

(56) References Cited

U.S. PATENT DOCUMENTS 6,925,203 B1    8/2005   Tanaka
2010/0271621 A1* 10/2010 Levy .................... G01N 21/211
                                                    356/73

* cited by examiner

F I G. 2
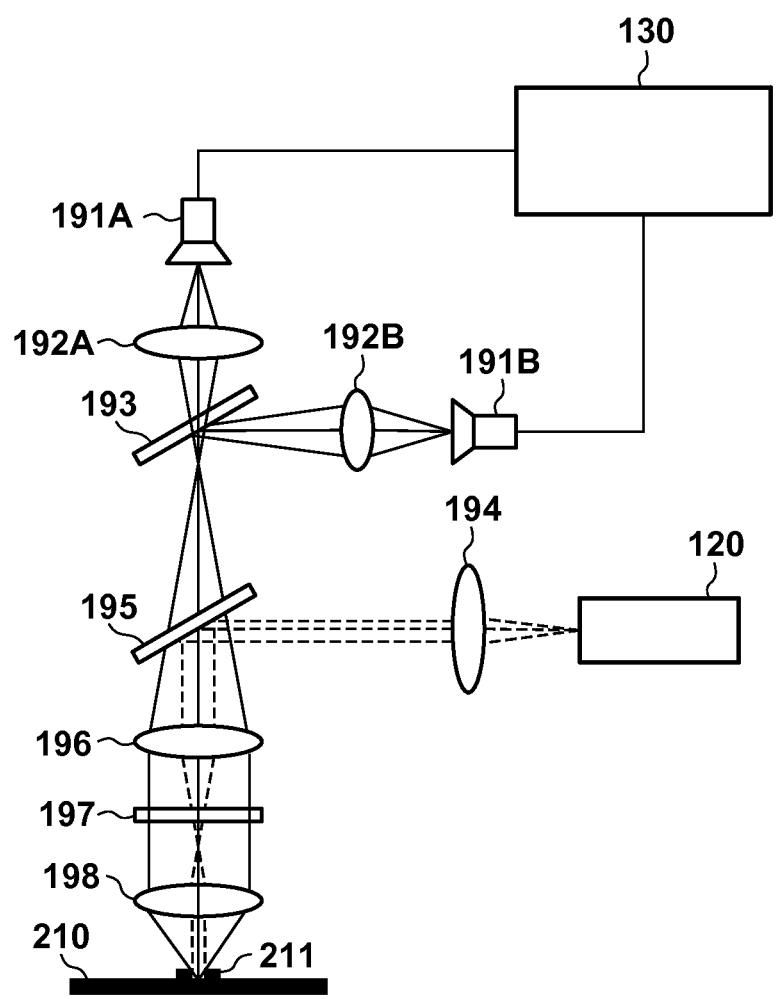

MEASUREMENT APPARATUS, LITHOGRAPHY APPARATUS, AND METHOD OF MANUFACTURING ARTICLE

BACKGROUND OF THE INVENTION

Field of the Invention

The present invention relates to a measurement apparatus, a lithography apparatus, and a method of manufacturing an article.

Description of the Related Art

When manufacturing a device such as a semiconductor element, liquid crystal display element, or thin-film magnetic head using a photolithography technique, an exposure apparatus that projects the pattern of a reticle to a substrate such as a wafer by a projection optical system and transfers the pattern is used.

Along with downsizing and growing in demand of an electronic device, an exposure apparatus needs to achieve miniaturization and productivity improvement of semiconductor elements represented by a memory and MPU. The exposure apparatus is, therefore, requested to improve basic performance such as a resolution, overlay accuracy, and throughput. Since the resolution of the exposure apparatus is inversely proportional to the numerical aperture (NA) of a projection optical system and is proportional to the wavelength of light (exposure light) used for exposure, the numerical aperture of the projection optical system has been increased and the wavelength of the exposure light has been shortened. Along with miniaturization of semiconductor elements, it is necessary to improve the overlay accuracy, and thus it is also necessary to improve the accuracy of alignment of the relative positions of a reticle and substrate.

As a technique for alignment of a substrate, there is known a technique of performing two kinds of alignment, that is, pre-alignment and fine alignment using an alignment mark provided on the substrate. In pre-alignment, the position shift amount of the substrate fed from a substrate conveyance system to a substrate stage is detected, and the substrate is roughly aligned (positioned) so as to start fine alignment. In fine alignment, the position of the substrate held by the substrate stage is accurately measured, and the substrate is finely aligned (positioned) so that the alignment error of the substrate falls within an allowance.

In pre-alignment, as described above, it is necessary to detect the position shift amount of the substrate fed from the substrate conveyance system to the substrate stage. An alignment optical system for detecting an alignment mark has a wide detection area (field) with respect to a mark size. Pattern matching (template matching) processing is often used to obtain the position (X and Y coordinates) of the alignment mark from the wide detection area.

In general, pattern matching processing is roughly classified into the following two types. One is a method of binarizing an image (grayscale image), performing matching with a template prepared in advance, and sets a position having the highest correlation as the position of an alignment mark. The other is a method of obtaining the position of an alignment mark by performing correlation calculation for a grayscale image with a template including grayscale information. In such pattern matching processing, it is difficult to detect an alignment mark with respect to a low-contrast image, a noise image, or an image including a defect caused when processing the substrate. To solve this problem, Japanese Patent Laid-Open No. 2000-260699 proposes a technique of allowing stable detection for an image in which it is difficult to detect an alignment mark. The technique disclosed in Japanese Patent Laid-Open No. 2000-260699 has as its feature to simultaneously extract the edge of a mark and the direction of the edge, and perform pattern matching by paying attention to the edge for each edge direction.

There are provided a movement measurement method and image processing method as alignment methods. In the movement measurement method, the position of an alignment mark provided on a substrate is obtained by illuminating the alignment mark with light (laser), and in parallel measuring a change in intensity of light reflected by the alignment mark and the position of a substrate stage while moving the substrate stage. In the image processing method, the position of an alignment mark provided on a substrate is obtained by illuminating the alignment mark with white light while a substrate stage stays still, detecting light reflected by the alignment mark using charge-accumulation type photoelectric conversion elements, and performing image processing.

As an alignment optical system used in such alignment methods, there are provided a TTL (Through-The-Lens) optical system, TTR (Through-The-Reticle) optical system, and off-axis optical system. The TTL optical system detects an alignment mark provided on a substrate via a projection optical system. The TTR optical system simultaneously detects an alignment mark provided on a reticle and an alignment mark provided on a substrate via a projection optical system. The off-axis optical system is a dedicated optical system having an optical axis at a predetermined distance from the optical axis of a projection optical system without intervention of the projection optical system, and detects an alignment mark provided on a substrate by emitting white light from a dedicated light source.

For example, in pre-alignment described above, the position of an alignment mark is obtained by performing pattern matching processing for the image information of all the pixels (a wide detection area with respect to a mark size) of charge-accumulation type photoelectric conversion elements. Therefore, pattern matching processing is performed for pixel information corresponding to a wide detection area including a region where no alignment mark exists. A time corresponding to the detection area is taken to obtain the position of the alignment mark.

SUMMARY OF THE INVENTION

The present invention provides, for example, a measurement apparatus advantageous in terms of a measurement time thereby.

According to one aspect of the present invention, there is provided a measurement apparatus for measuring a position of a mark formed on a substrate, the apparatus including a detector configured to detect the mark to generate a detection signal, and a processor configured to process the generated detection signal to obtain a position of the mark, wherein the processor is configured to limit a range of the detection signal to be processed to obtain the position of the mark based on a statistic representing dispersion of a plurality of the position obtained with respect to a plurality of the mark.

Further features of the present invention will become apparent from the following description of exemplary embodiments with reference to the attached drawings.

BRIEF DESCRIPTION OF THE DRAWINGS

FIG. 2 is a schematic view showing the arrangement of a substrate alignment optical system.

DESCRIPTION OF THE EMBODIMENTS

Figure 1:
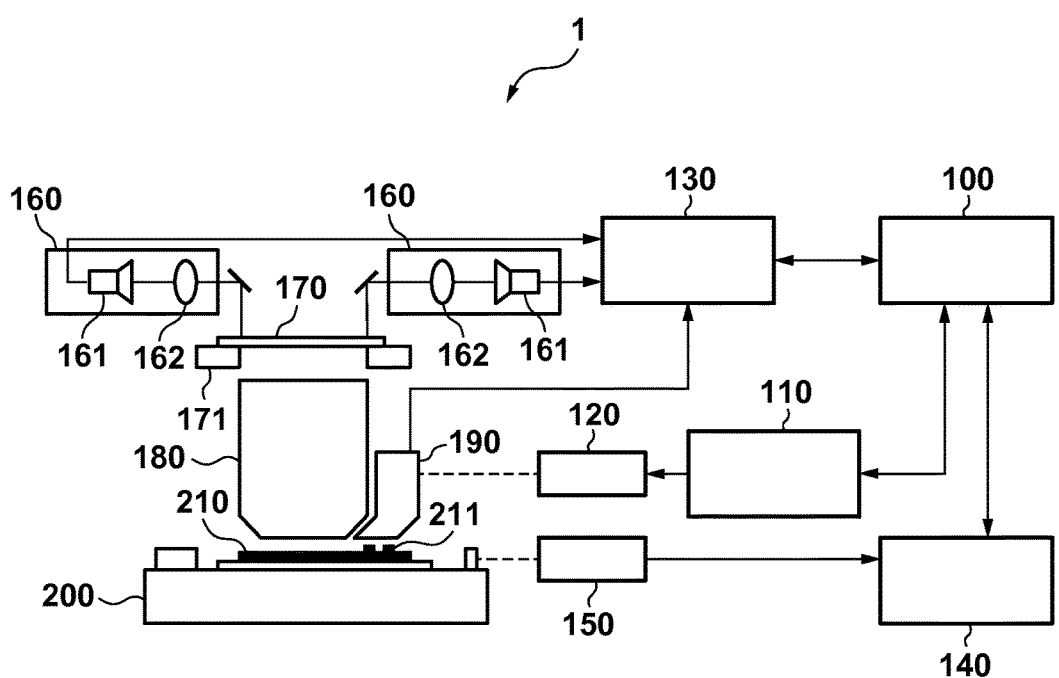
FIG. 1 is a schematic view showing the arrangement of an exposure apparatus according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 1 according to one aspect of the present invention. The exposure apparatus 1 is a lithography apparatus that is used to manufacture a device such as a semiconductor element, liquid crystal display element, or thin-film magnetic head as an article, and performs patterning on a substrate. The exposure apparatus 1 exposes the substrate by a step-and-scan method or step-and-repeat method.

The exposure apparatus 1 includes a main control unit 100, a light source control unit 110, an alignment light source 120, an image processing unit 130, a stage control unit 140, and an interferometer 150. The exposure apparatus 1 also includes reticle alignment optical systems 160, a reticle stage 171, a projection optical system 180, a substrate alignment optical system 190, and a substrate stage 200.

The reticle stage 171 moves while holding a reticle 170 to be illuminated by an illumination optical system (not shown). A pattern to be transferred to a substrate 210 is drawn in the reticle 170. The projection optical system 180 projects the pattern of the reticle 170 on the substrate 210. The substrate stage 200 serves as a holding unit which is movable while holding a substrate. In this embodiment, the substrate stage 200 moves while holding the substrate 210.

The reticle alignment optical systems 160 are used to align the reticle 170. Each reticle alignment optical system 160 includes, for example, an imaging device 161 formed by charge-accumulation type photoelectric conversion elements, and an optical system 162 for guiding light from an alignment mark provided on the reticle 170 to the imaging device 161. The substrate alignment optical system 190 is used to align the substrate 210. In this embodiment, the substrate alignment optical system 190 is an off-axis optical system, and detects an alignment mark 211 provided on the substrate 210.

The main control unit 100 includes a CPU and memory, and controls the overall operation of the exposure apparatus 1. The main control unit 100 controls the respective units of the exposure apparatus 1, and performs exposure processing of exposing the substrate 210 and its associated processing. In this embodiment, the main control unit 100 controls the position of the substrate stage 200 based on the position of the alignment mark formed on the reticle 170 and the alignment mark 211 formed on the substrate 210. In other words, the main control unit 100 performs alignment of the reticle 170 and the substrate 210, for example, global alignment.

The alignment light source 120 includes a halogen lamp, and illuminates the alignment mark 211 formed on the substrate 210. The light source control unit 110 controls the illumination intensity of light from the alignment light source 120, that is, light used to illuminate the alignment mark 211.

The image processing unit 130 obtains the position of the alignment mark by performing image processing for image signals (detection signals) from the imaging devices 161 of the reticle alignment optical systems 160 and the imaging device of the substrate alignment optical system 190. In this embodiment, the image processing unit 130 and the substrate alignment optical system 190 function as a measurement apparatus for measuring the position of the alignment mark 211 formed on the substrate 210.

The interferometer 150 emits light to a mirror provided on the substrate stage 200, and detects light reflected by the mirror, thereby measuring the position of the substrate stage 200. The stage control unit 140 moves (controls driving) the substrate stage 200 to an arbitrary position based on the position of the substrate stage 200 measured by the interferometer 150.

In the exposure apparatus 1, light (exposure light) from the illumination optical system passes through the reticle 170 held by the reticle stage 171, and enters the projection optical system 180. Since the reticle 170 and the substrate 210 have an optically conjugated positional relationship, the pattern of the reticle 170 is transferred, via the projection optical system 180, to the substrate 210 held by the substrate stage 200.

FIG. 2 is a schematic view showing the arrangement of the substrate alignment optical system 190. The substrate alignment optical system 190 functions as a detection unit that detects the alignment mark 211 formed on the substrate 210 to generate a detection signal, in this embodiment, an image signal. The substrate alignment optical system 190 includes imaging devices 191A and 191B, imaging optical systems 192A and 192B, a half mirror 193, an illumination optical system 194, a polarizing beam splitter 195, a relay lens 196, a λ/4 plate 197, and an objective lens 198.

Light from the alignment light source 120 is guided to the substrate alignment optical system 190 via an optical fiber (not shown) or the like. The light guided to the substrate alignment optical system 190 enters the polarizing beam splitter 195 via the illumination optical system 194. Light reflected by the polarizing beam splitter 195 passes through the relay lens 196, λ/4 plate 197, and objective lens 198, and the alignment mark 211 formed on the substrate 210 is illuminated with the light.

Light reflected by the alignment mark 211 passes through the objective lens 198, λ/4 plate 197, relay lens 196, and polarizing beam splitter 195, and enters the half mirror 193. Each of light beams divided by the half mirror 193 at an appropriate ratio is guided to one of the imaging optical systems 192A and 192B having different imaging magnifications.

The imaging optical systems 192A and 192B form images of the alignment mark 211 on the imaging planes of the imaging devices 191A and 191B, respectively. Each of the imaging devices 191A and 191B includes the imaging plane on which a region including the alignment mark 211 is captured, and generates an image signal corresponding to the region captured on the imaging plane. The image processing unit 130 reads out the image signals generated by the imaging devices 191A and 191B. In this embodiment, the image processing unit 130 performs pattern matching processing as image processing for the image signals, thereby obtaining the position of the alignment mark 211 on each of the imaging planes of the imaging devices 191A and 191B. Note that image processing is not limited to pattern matching processing, and any processing capable of obtaining the position of the alignment mark 211 may be performed. Therefore, image processing may be, for example, edge detection processing.

In the exposure apparatus 1, the two kinds of alignment, that is, pre-alignment and fine alignment are performed using the alignment mark 211. In pre-alignment, the position shift amount of the substrate 210 fed from a substrate conveyance system to the substrate stage 200 is detected, and the substrate 210 is roughly aligned (positioned) so as to start fine alignment. In fine alignment, the position of the substrate 210 held by the substrate stage 200 is accurately measured, and the substrate 210 is finely aligned (positioned) so that the alignment error of the substrate 210 falls within an allowance.

Pre-alignment in the exposure apparatus 1 will be described in detail. In this embodiment, in pre-alignment, the substrate alignment optical system 190 is used to detect the alignment mark 211 formed on the substrate 210. The imaging device 191B of the substrate alignment optical system 190 used for pre-alignment has a wide detection field in consideration of the position shift amount of the substrate 210 fed from the substrate conveyance system to the substrate stage 200. If, for example, the size (a region corresponding to it) of the alignment mark 211 ranges from 50 µm to 100 µm, the imaging device 191B has a detection field of about 200 µm to 400 µm.

Assume that three times the standard deviation of the position shift amount of the substrate 210 fed from the substrate conveyance system to the substrate stage 200 is stable at about 25 µm. Assume also that the position of the alignment mark 211 is obtained by performing pattern matching processing for the image information of all the pixels (that is, the entire range of the detection signal) of the imaging plane of the imaging device 191B. In this case, most of the pixel information of the imaging plane of the imaging device 191B are those in which no alignment mark 211 exists. Therefore, pattern matching processing is performed for image information corresponding to a wide detection area including a region where no alignment mark 211 exists. Consequently, the time is wasted to obtain the position of the alignment mark 211, which decreases the substrate processing capability, that is, the throughput of the exposure apparatus 1.

To solve this problem, in this embodiment, in the detection signal corresponding to the alignment mark 211 detected by the substrate alignment optical system 190, a range (or area or region) to be processed to obtain the position of the alignment mark 211 is limited (determined). When limiting the area, a statistic representing the dispersion of the positions of the alignment marks 211, which has been obtained from the image signals corresponding to the plurality of alignment marks 211 detected by the substrate alignment optical system 190 in the past, is used. In other words, based on the statistic, the area to be processed to obtain the position of the alignment mark 211 in the detection signal when obtaining the position of the alignment mark 211 detected subsequently to the alignment marks 211 detected so far is limited. This can reduce the time taken to obtain the position of the alignment mark 211. The statistic representing the dispersion of the positions of the alignment marks 211 includes a value (for example, a mean or a standard deviation itself) based on the standard deviation of the positions of the plurality of alignment marks 211 detected by the substrate alignment optical system 190 in the past.

Figure 3:
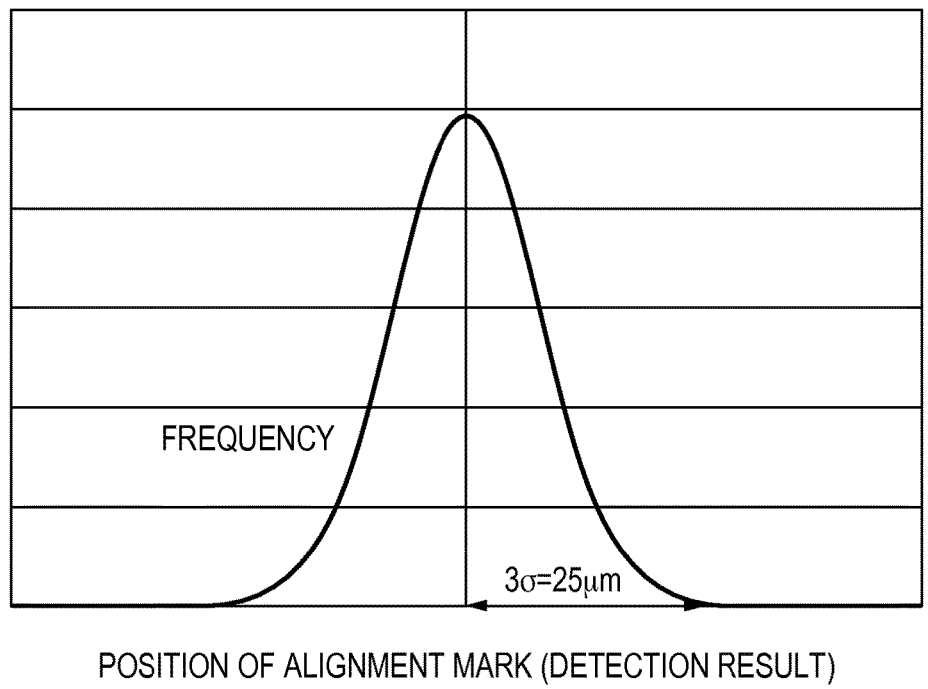
FIG. 3 is view showing a histogram of the position shift amount of a substrate fed to a substrate stage.
Figure 4:
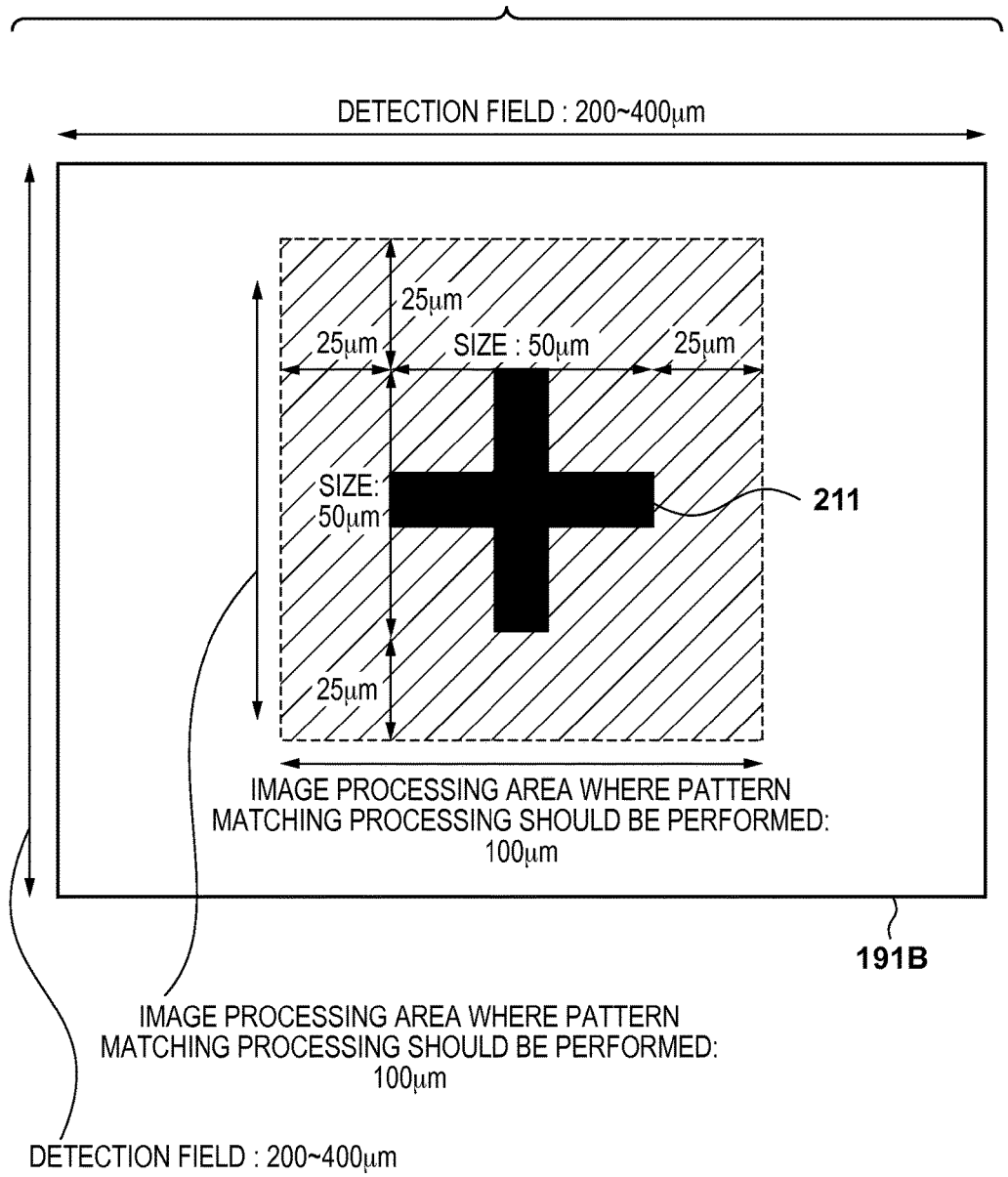
FIG. 4 is a view showing the relationship between an alignment mark and an image processing area where pattern matching processing is to be performed.

Limiting the area to be processed to obtain the position of the alignment mark 211, in this embodiment, limiting an image processing area where pattern matching processing as image processing is to be performed will be described in detail. FIG. 3 is a view showing a histogram of the position shift amount of the substrate 210 fed from the substrate conveyance system to the substrate stage 200, that is, the relationship between the positions of the plurality of alignment marks 211 (detection results) detected by the substrate alignment optical system 190 in the past and their frequencies. With reference to FIG. 3, it is found that three times (3σ) the standard deviation of the positions of the plurality of alignment marks 211 detected by the substrate alignment optical system 190 in the past is about 25 µm. In this case, as shown in FIG. 4, the image processing area where pattern matching processing should be performed in the image signal can be narrowed to about 100 µm×100 µm. In other words, it is possible to narrow the image processing area to be processed to obtain the position of the alignment mark 211 to be detected to an area smaller than the image processing area having undergone pattern matching processing to obtain the position of the alignment mark 211 detected in the past. At this time, the image processing area is determined based on the size (dimensions) of the alignment mark 211 and the mean of the positions of the alignment marks 211 detected in the past. More specifically, an area (100 µm×100 µm) obtained by adding an area (25 µm) corresponding to the dispersion of the positions of the alignment marks 211 to an area (50 µm×50 µm) corresponding to the size of the alignment mark 211 is determined as an image processing area. As described above, it is possible to reduce the time taken to obtain the position of the alignment mark 211 by limiting the image processing area where pattern matching processing should be performed.

In this embodiment, an example in which the image processing area where pattern matching processing as image processing is to be performed is limited has been explained. The present invention, however, is not limited to this. For example, instead of limiting the image processing area, a readout area where an image signal is read out on the imaging plane of the imaging device 191B of the substrate alignment optical system 190 may be limited (that is, the imaging device may read out image processing corresponding to the image processing area). In this case, it is also possible to reduce the time taken to obtain the position of the alignment mark 211.

An area to be processed to obtain the position of the alignment mark 211 may be limited (determined) for each upper limit of patterning, that is, each exposure condition (recipe) under which the substrate 210 is exposed. Note that the exposure condition includes at least one of the size of the substrate 210, the number of shot regions, and an illumination condition under which the alignment mark 211 is illuminated.

In addition, by limiting an area to be processed to obtain the position of the alignment mark 211, it may become impossible to obtain the position of the alignment mark 211 (that is, the alignment mark 211 may exist outside the area). In this case, the area to be processed to obtain the position of the alignment mark 211 need only be changed (enlarged) so as to obtain the position of the alignment mark 211. For example, it is only necessary to change the area to be processed to obtain the position of the alignment mark 211 so that pattern matching processing is performed for the pixel information of all the pixels of the imaging plane of the imaging device 191B, that is, the entire area of the detection signal is processed.

In fact, there may be a case in which the substrate alignment optical system 190 has not detected the alignment marks 211 the number of which makes it possible to obtain a statistic representing the dispersion of the positions of the alignment marks 211. In this case, an area to be processed to obtain the position of the alignment mark 211 is limited (determined) based on the positions of the alignment marks 211 detected by the substrate alignment optical system 190 in the past. For example, if the number of alignment marks 211 (the number of samples) detected by the substrate alignment optical system 190 in the past is equal to or larger than a predetermined number, the area to be processed to obtain the position of the alignment mark 211 is determined based on the statistic, as described above. On the other hand, if the number of alignment marks 211 detected by the substrate alignment optical system 190 in the past is smaller than the predetermined number, the area to be processed to obtain the position of the alignment mark 211 is determined based on the positions of the alignment marks 211. Note that the predetermined number is set to, for example, a minimum number which makes it possible to obtain a statistic representing the dispersion of the positions of the alignment marks 211.

For example, when performing pre-alignment, in general, before the position of the alignment mark 211 formed on the substrate 210 is measured, it is confirmed whether light from the alignment mark 211 enters the imaging device 191B of the substrate alignment optical system 190 with an appropriate light amount. The position of the alignment mark 211 is roughly measured by performing pattern matching processing when confirming the light amount of the light entering the imaging device 191B. In pre-alignment, based on the measured position of the alignment mark 211, the image processing area where pattern matching processing is to be performed is limited. This can reduce the time taken to obtain the position of the alignment mark 211 even if no statistic has been obtained.

Figure 5A:
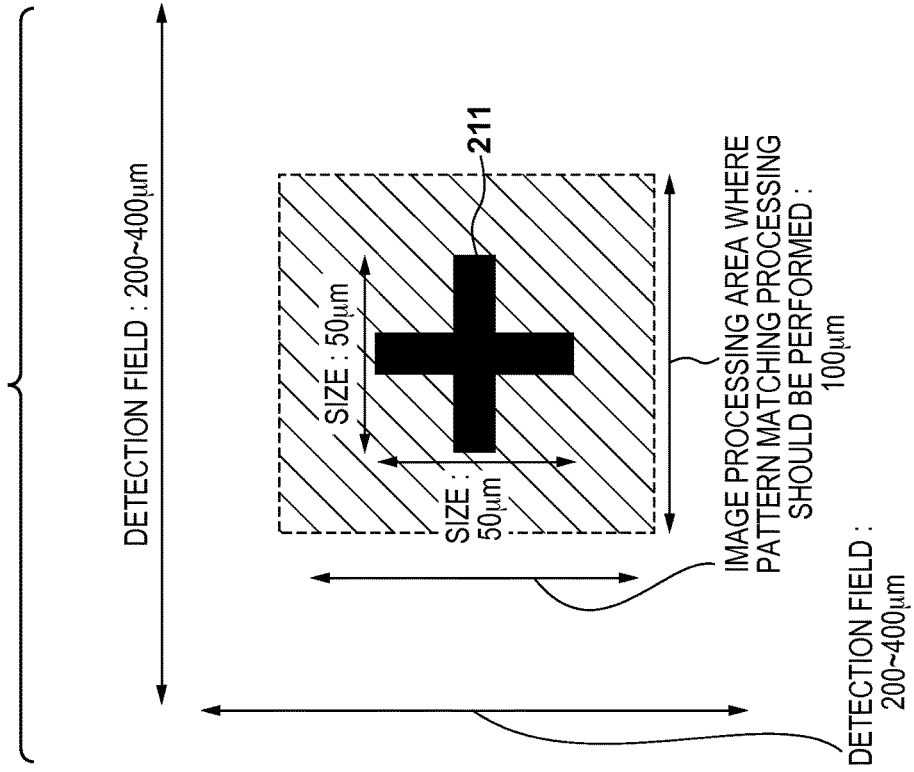
FIGS. 5A and 5B are views each showing the relationship between an alignment mark and an image processing area where pattern matching processing is to be performed.
Figure 5B:
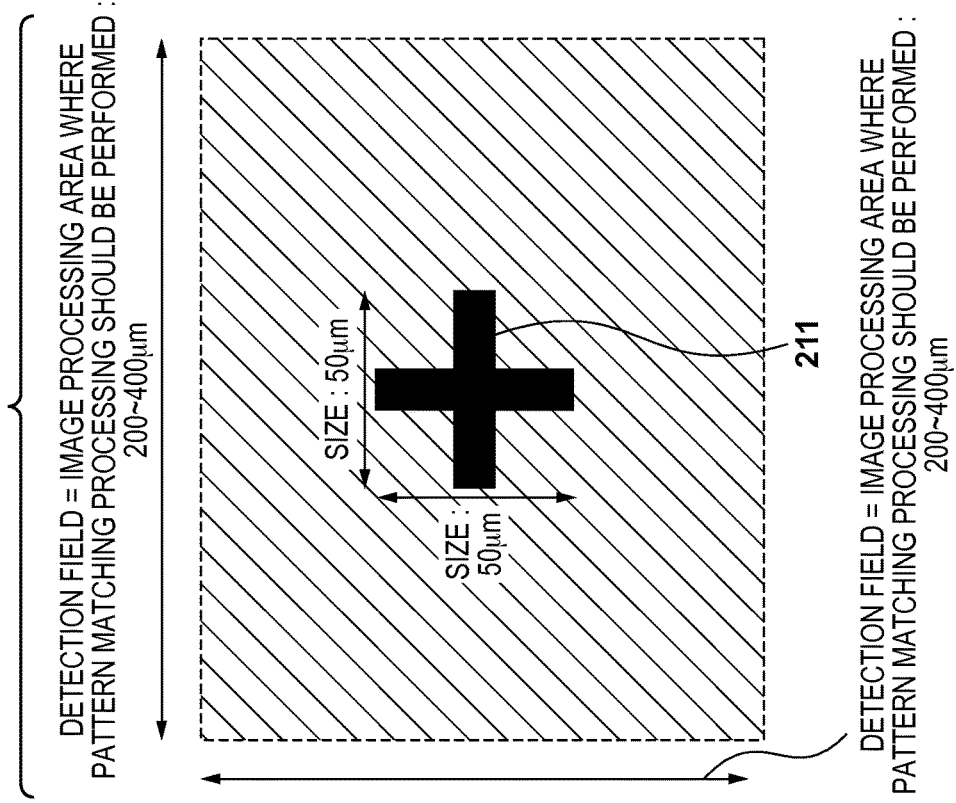

For example, as shown in FIG. 5A, when confirming the light amount of the light entering the imaging device 191B, pattern matching processing is performed for the pixel information of all the pixels of the imaging plane of the imaging device 191B. In other words, the image processing area to be processed to obtain the position of the alignment mark 211 is determined so that pattern matching processing is performed for the entire area of the image signal. In pre-alignment, as shown in FIG. 5B, based on the position of the alignment mark 211 obtained when confirming the light amount of the light entering the imaging device 191B, the image processing area where pattern matching processing should be processed is narrowed to about 100 μm×100 μm. In this example, the image processing area is determined in consideration of the area corresponding to the size of the alignment mark 211 by centering the position of the alignment mark 211 roughly measured when confirming the light amount of light entering the imaging device 191B.

The pattern matching processing performed when roughly measuring the position of the alignment mark 211 and that performed when measuring the position of the alignment mark 211 in pre-alignment may use different templates.

As described above, the exposure apparatus 1 according to this embodiment can reduce the time taken to measure the position of the alignment mark 211. Therefore, the exposure apparatus 1 can sufficiently suppress a decrease in throughput, thereby providing a high-throughput, cost-effective, high-quality device (semiconductor device, liquid crystal display device, or the like).

A method of manufacturing an article according to an embodiment of the present invention is suitable for manufacturing an article, for example, a microdevice such as a semiconductor device or an element having a microstructure. The manufacturing method includes a step of exposing a substrate applied with a photosensitive agent using the exposure apparatus 1 (a step of performing patterning on a substrate), and a step of developing the exposed substrate (a step of processing the substrate having undergone patterning). This manufacturing method can further include other well-known steps (for example, oxidization, deposition, vapor deposition, doping, planarization, etching, resist removal, dicing, bonding, and packaging) following the above forming step. The article manufacturing method according to the embodiment is superior to a conventional method in at least one of the performance, quality, productivity, and production cost of an article.

Furthermore, the present invention is applicable to not only pre-alignment but also fine alignment and other alignment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-226407 filed on Nov. 6, 2014, which is hereby incorporated by reference herein in its entirety.

What is claimed is:

1. A measurement apparatus for measuring a position of a mark formed on a substrate, the measurement apparatus comprising:
   a detector configured to generate a detection signal for detecting the mark; and
   a controller configured to determine, from an obtaining region of the detection signal, a partial region where an image processing is to be performed; and
   an image processor configured to perform the image processing for the determined partial region to obtain a position of the mark,
   wherein the controller is configured to determine the partial region, where the image processing is to be performed, based on a statistic representing dispersion of positions of marks, associated with the mark, having been obtained.

2. The measurement apparatus according to claim 1, wherein the controller is configured to determine the partial region further based on a mean of the positions and a dimension of the mark.

3. The measurement apparatus according to claim 1, wherein the detector includes an imaging device configured to image the mark to generate an image signal as the detection signal.

4. The measurement apparatus according to claim 3, wherein the image processor is configured to cause the imaging device to read out the image signal corresponding to the determined partial region.

5. The measurement apparatus according to claim 1, wherein the image processor is configured to perform pattern matching processing or edge detection processing to obtain the position of the mark.

6. The measurement apparatus according to claim 1, wherein the controller is configured to determine the partial region based on the statistic in a case where a number of samples for obtaining the statistic is not less than a predetermined number.

7. The measurement apparatus according to claim 1, wherein the controller is configured to enlarge the partial region in a case where the partial region is determined to process the generated detection signal and the position of the mark is not obtained.

8. The measurement apparatus according to claim 1, wherein the statistic includes a value based on a standard deviation of the positions.

9. A lithography apparatus for performing patterning on a substrate, the lithography apparatus comprising:
   a holder configured to hold the substrate and be movable;
   a measurement apparatus configured to measure a position of a mark formed on the substrate; and
   a position controller configured to control a position of the holder based on the measured position of the mark,
   wherein the measurement apparatus includes:
      a detector configured to generate a detection signal for detecting the mark;
      a controller configured to determine, from an obtaining region of the detection signal, a partial region where an image processing is to be performed; and
      an image processor configured to perform the image processing for the determined partial region to obtain a position of the mark,
      wherein the controller is configured to determine the partial region, where the image processing is to be performed, based on a statistic representing dispersion of positions of marks, associated with the mark, having been obtained.

10. The lithography apparatus according to claim 9, wherein the controller is configured to determine the partial region with respect to each of conditions of the patterning.

11. A method of manufacturing an article, the method comprising the steps of:
   performing patterning on a substrate using an lithography apparatus; and
   processing the substrate, on which the patterning has been performed, to manufacture the article,
   wherein the lithography apparatus includes:
      a holder configured to hold the substrate and be movable;
      a measurement apparatus configured to measure a position of a mark formed on the substrate; and
      a position controller configured to control a position of the holder based on the measured position of the mark,
   wherein the measurement apparatus includes:
      a detector configured to generate a detection signal for detecting the mark;
      a controller configured to determine, from an obtaining region of the detection signal, a partial region where an image processing is to be performed; and
      an image processor configured to perform the image processing for the determined partial region to obtain a position of the mark,
      wherein the controller is configured to determine the partial region, where the image processing is to be performed, based on a statistic representing dispersion of positions of marks, associated with the mark, having been obtained.

12. The measurement apparatus according to claim 1, wherein the positions have been obtained with respect to substrates for which a recipe is the same as that for the substrate.

13. The lithography apparatus according to claim 9, wherein the positions have been obtained with respect to substrates for which a recipe of the patterning is the same as that for the substrate.

14. The method according to claim 11, wherein the positions have been obtained with respect to substrates for which a recipe of the patterning is the same as that for the substrate.

15. A measurement apparatus for measuring a position of a mark formed on a substrate, the measurement apparatus comprising:
   a detector configured to generate a detection signal for detecting the mark;
   a controller configured to determine an obtaining region of the detection signal; and
   an image processor configured to perform an image processing for the determined obtaining region of the detection signal to obtained a position of the mark,
   wherein the controller is configured to determine the obtaining region of the detection signal based on a statistic representing dispersion of positions of marks, associated with the mark, having been obtained.

* * * * *